United States Patent
Park et al.

(10) Patent No.: US 7,265,449 B2
(45) Date of Patent: Sep. 4, 2007

(54) TAPE CIRCUIT SUBSTRATE, SEMICONDUCTOR CHIP PACKAGE INCLUDING THE SAME, AND LIQUID CRYSTAL DISPLAY DEVICE INCLUDING THE SEMICONDUCTOR CHIP PACKAGE

(75) Inventors: Hee-bum Park, Seongnam-si (KR); Ock-jin Kim, Hwaseong-si (KR); Jin-ho Park, Suwon-si (KR); Kwang-soo Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 105 days.

(21) Appl. No.: 11/186,096

(22) Filed: Jul. 21, 2005

(65) Prior Publication Data

US 2006/0038298 A1    Feb. 23, 2006

(30) Foreign Application Priority Data

Aug. 23, 2004   (KR) .................... 10-2004-0066274

(51) Int. Cl.
*H01L 23/48* (2006.01)
*H01L 23/52* (2006.01)
*H01L 29/40* (2006.01)
*H01L 23/14* (2006.01)

(52) U.S. Cl. .............. 257/773; 257/772; 257/692; 257/775; 257/702; 257/E23.027

(58) Field of Classification Search ........... 257/773, 257/772, 775, 692, 702; 349/149–152
See application file for complete search history.

(56) References Cited

U.S. PATENT DOCUMENTS

| | | | |
|---|---|---|---|
| 6,285,433 B1 * | 9/2001 | Kawasaki | 349/149 |
| 6,518,557 B1 * | 2/2003 | Izumi et al. | 250/208.1 |
| 6,633,361 B1 * | 10/2003 | Fujita | 349/152 |
| 2001/0033355 A1 * | 10/2001 | Hagiwara | 349/152 |

FOREIGN PATENT DOCUMENTS

| | | |
|---|---|---|
| EP | 1204306 | 11/2001 |
| JP | 07072508 | 3/1995 |
| JP | 2003-280027 | 10/2003 |
| JP | 2004-47335 A | 2/2004 |

OTHER PUBLICATIONS

European Search Report dated Sep. 7, 2006 for Application No. 05107021.7 (All reference cited in Search Report are cited above).

* cited by examiner

*Primary Examiner*—Nitin Parekh
(74) *Attorney, Agent, or Firm*—Cantor Colburn LLP

(57) ABSTRACT

A liquid crystal display device includes a liquid crystal panel including a pad electrode, a tape circuit substrate and an anisotropic conductive film. The pad electrode receives one of a driving signal and a power supply voltage signal. The tape circuit substrate includes a base film made of an insulating material, and a signal line formed on the base film and having a slit at a portion of the signal line which overlaps the pad electrode of the liquid crystal panel. The anisotropic conductive film connects the outer lead with the pad electrode.

22 Claims, 6 Drawing Sheets

TAPE CIRCUIT SUBSTRATE, SEMICONDUCTOR CHIP PACKAGE INCLUDING THE SAME, AND LIQUID CRYSTAL DISPLAY DEVICE INCLUDING THE SEMICONDUCTOR CHIP PACKAGE

This application claims priority from Korean Patent Application No. 10-2004-066274 filed on Aug. 23, 2004 in the Korean Intellectual Property Office, the disclosure of which is incorporated herein by reference in its entirety.

BACKGROUND OF THE INVENTION

1. Field of the Invention

The present invention relates to a tape circuit substrate, a semiconductor chip package including the same, and a liquid crystal display (LCD) device including the semiconductor chip package. More particularly, the present invention relates to a tape circuit substrate capable of improving contact reliability and reducing contact resistance between an outer lead of the tape circuit substrate and a pad electrode of an LCD device, a semiconductor chip package including the tape circuit substrate, and an LCD device including the semiconductor chip package.

2. Description of the Related Art

There is currently a trend toward production of large sized image display devices, such as television (TV) monitors, to replace cathode ray tube (CRT) devices. Examples of the image display devices include flat panel display devices such as LCD devices, plasma display panel (PDP) devices, and organic electroluminescent displays (OELD) devices. Of the flat panel display devices listed above, LCD devices that can be made light and thin have been particularly popular.

LCD devices include an upper transparent insulating substrate, on which a common electrode, a color filter, a black matrix, etc. are formed, and a lower transparent insulating substrate, on which a thin film transistor (TFT), a pixel electrode, etc. are formed. A liquid crystal material having an anisotropic dielectric constant is injected between the upper and lower transparent insulating substrates. Different potentials are then applied to the pixel electrode and the common electrode, respectively, to adjust a strength of an electric field formed in the liquid crystal material, thereby changing a molecular alignment of the liquid crystal material. By changing the molecular alignment of the liquid crystal material, light transmitted through the upper and lower transparent insulating substrates is adjusted so that images are displayed. Among such LCD devices, a TFT LCD device using a TFT as a switching element is often used.

Figure 1A:
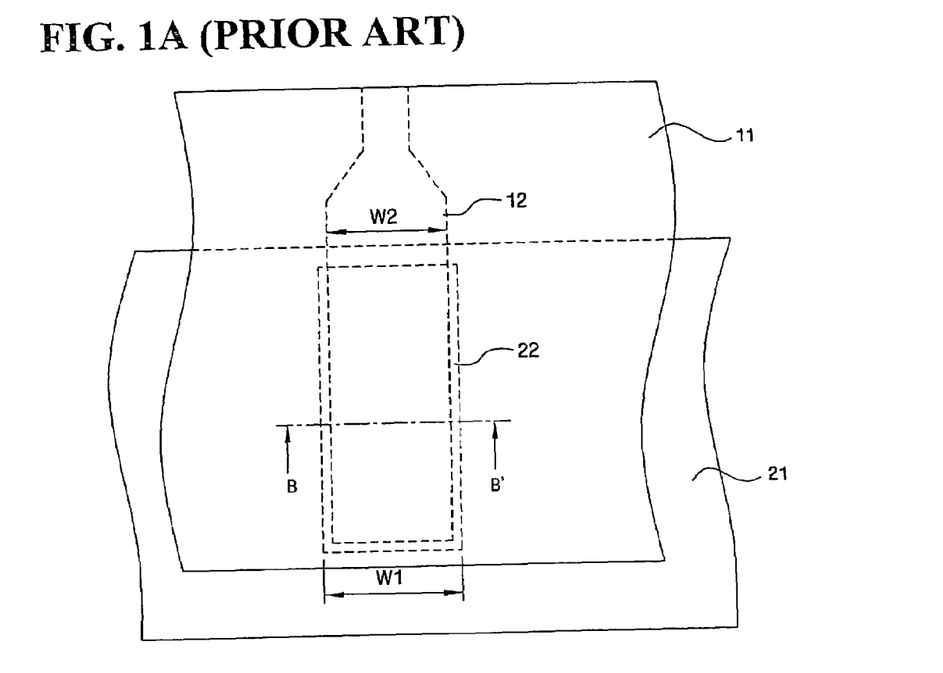
FIG. 1A is a plan view illustrating a conventional connection between a pad electrode of a liquid crystal display (LCD) device and an outer lead of a tape circuit substrate.
Figure 1B:
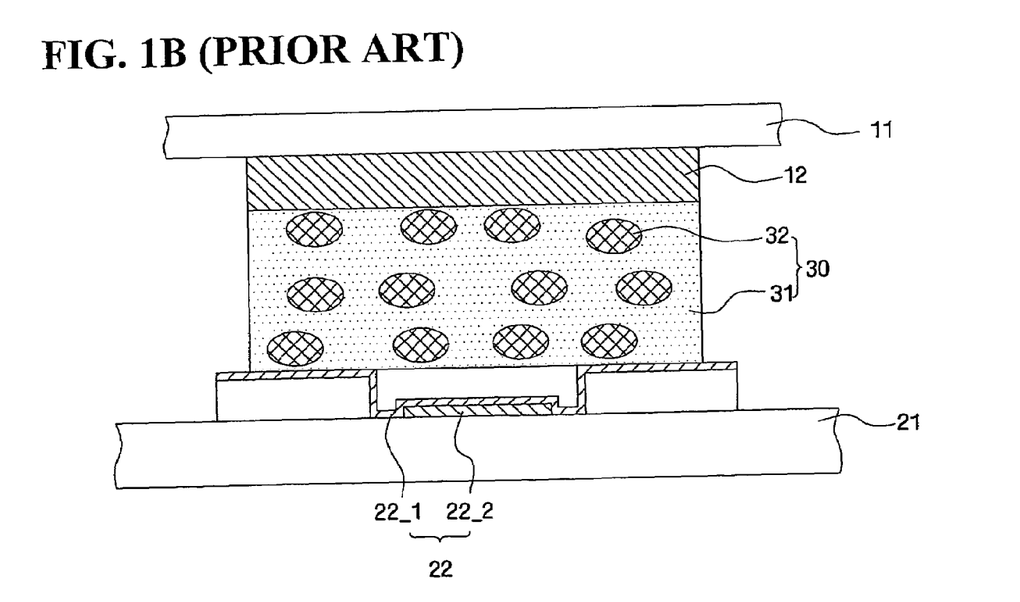
FIG. 1B is a sectional view taken along line B-B' shown in FIG. 1A.

An LCD device needs drive-use semiconductor chips to drive a TFT. For a printed circuit board on which drive-use semiconductor chips are installed, a tape circuit substrate made by forming a circuit pattern on a flexible base film is usually used. Connection between a pad electrode of an LCD device and an outer lead of the tape circuit substrate will be described with reference to FIGS. 1A and 1B. FIG. 1A is a plan view illustrating a conventional connection between a pad electrode of an LCD device and an outer lead of a tape circuit substrate. FIG. 1B is a sectional view taken along line B-B' shown in FIG. 1A.

The tape circuit substrate includes an inner lead (not shown) connected with a bump electrode (not shown) on a drive-use semiconductor chip and an outer lead 12 which is formed on a base film 11 and connected with a pad electrode 22 of an LCD device 21, to which a driving signal for driving a TFT or a power supply voltage signal is input. The pad electrode 22 may include both a first conductive layer 22_2 and a second conductive layer 22_1. The pad electrode 22 of the LCD device 21 contacts the outer lead 12 of the tape circuit substrate in a predetermined region, as shown by the overlap portion of the pad electrode 22 and the outer lead 12 in FIG. 1A.

A method of connecting the pad electrode 22 and the outer lead 12 employs an anisotropic conductive film (ACF) 30, as shown in FIG. 1B. The ACF 30 includes conductive balls 32 dispersed within a thermosetting resin such as an epoxy resin 31. When the ACF 30 is positioned between the pad electrode 22 of the LCD device 21 and the outer lead 12 of the tape circuit substrate and then pressurized, the epoxy resin 31 of the ACF 30 spreads out to a side space of the pad electrode 22 and the outer lead 12. Thus, the epoxy resin 31 is hardened and the conductive balls 32 are pressed between the pad electrode 22 of the LCD device 21 and the outer lead 12 of the tape circuit substrate. As a result, the pad electrode 22 of the LCD device 21 and the outer lead 12 of the tape circuit substrate are electrically connected with each other via the conductive balls 32.

A width W1 of the pad electrode 22 of the LCD device 21 receiving a power supply voltage signal and a width W2 of the outer lead 12 of the tape circuit substrate connected with the pad electrode 22 are greater than a width of other leads and electrodes (for example, a pad electrode of the LCD device 21 receiving a data signal and an outer lead of the tape circuit substrate connected thereto), and therefore, contact resistance between the pad electrode 22 of the LCD device 21 and the outer lead 12 of the tape circuit substrate is reduced. As a result, current flow in the pad electrode 22 of the LCD device 21 and the outer lead 12 of the tape circuit substrate may be increased.

However, when the ACF 30 is positioned and pressurized between the pad electrode 22 having the width W1 and the outer lead 12 having the width W2 for electrical connection, the epoxy resin 31 of the ACF 30 may be hardened without spreading out to the side space. If the epoxy resin hardens without spreading out to the side space, the conductive balls 32 do not satisfactorily contact the pad electrode 22 of the LCD device 21 and the outer lead 12 of the tape circuit substrate.

As a result, contact reliability between the pad electrode 22 of the LCD device 21 and the outer lead 12 of the tape circuit substrate cannot be effectively achieved. Thus, if the width W1 of the pad electrode 22 of the LCD device 21 and the width W2 of the outer lead 12 of the tape circuit substrate are decreased to achieve contact reliability, the contact resistance between the pad electrode 22 of the LCD device 21 and the outer lead 12 of the tape circuit substrate cannot be reduced effectively.

SUMMARY OF THE INVENTION

The present invention provides a tape circuit substrate capable of improving contact reliability and reducing contact resistance between an outer lead of a tape circuit substrate and a pad electrode of a liquid crystal display (LCD) device. The present invention also provides a semiconductor chip package including the tape circuit substrate. The present invention also provides an LCD device including the semiconductor chip package.

The above stated and other features and advantages of the present invention will become clear to those skilled in the art upon review of the following description, the attached drawings and appended claims.

According to an aspect of the present invention, there is provided a liquid crystal display device including a liquid crystal panel including a pad electrode receiving one of a driving signal and a power supply voltage signal, a tape circuit substrate including a base film made of an insulating material, a signal line formed on the base film and having a slit at a portion of the signal line which overlaps the pad electrode of the liquid crystal panel, and an anisotropic conductive film connecting the signal line with the pad electrode.

According to another aspect of the present invention, there is provided a semiconductor chip package including a tape circuit substrate and a semiconductor chip. The tape circuit substrate includes a base film made using an insulating material, an inner lead electrically connected to a semiconductor chip, an outer lead formed on the base film and having a slit disposed at an overlap region between a pad electrode of a liquid crystal panel and the outer lead, and a connection wire formed on the base film to electrically connect the inner lead to the outer lead. The semiconductor chip is mounted on the tape circuit substrate to be electrically connected to the inner lead.

According to still another aspect of the present invention, there is provided a tape circuit substrate including a base film made of an insulating material, an inner lead, an outer lead and a connection wire. The inner lead is electrically connected to a semiconductor chip. The outer lead is formed on the base film and has a slit disposed at an overlap region between a pad electrode of a liquid crystal panel and the outer lead. The slit is formed at an end portion of the outer lead. The connection wire is formed on the base film to electrically connect the inner lead to the outer lead.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

In a liquid crystal display (LCD) device according to an exemplary embodiment of the present invention, a slit having a length less than that of an overlapping region in which a pad electrode of a liquid crystal panel overlaps with an outer lead of a tape circuit substrate and having a width less than that of the overlapping region is formed at an end portion of the outer lead of the tape circuit substrate, which contacts the pad electrode of the liquid crystal panel, to improve contact reliability and decrease contact resistance between the outer lead of the tape circuit substrate and the pad electrode of the liquid crystal panel.

A semiconductor chip package according to an exemplary embodiment of the present invention will be described with reference to FIGS. 2A and 2B.

Figure 2A:
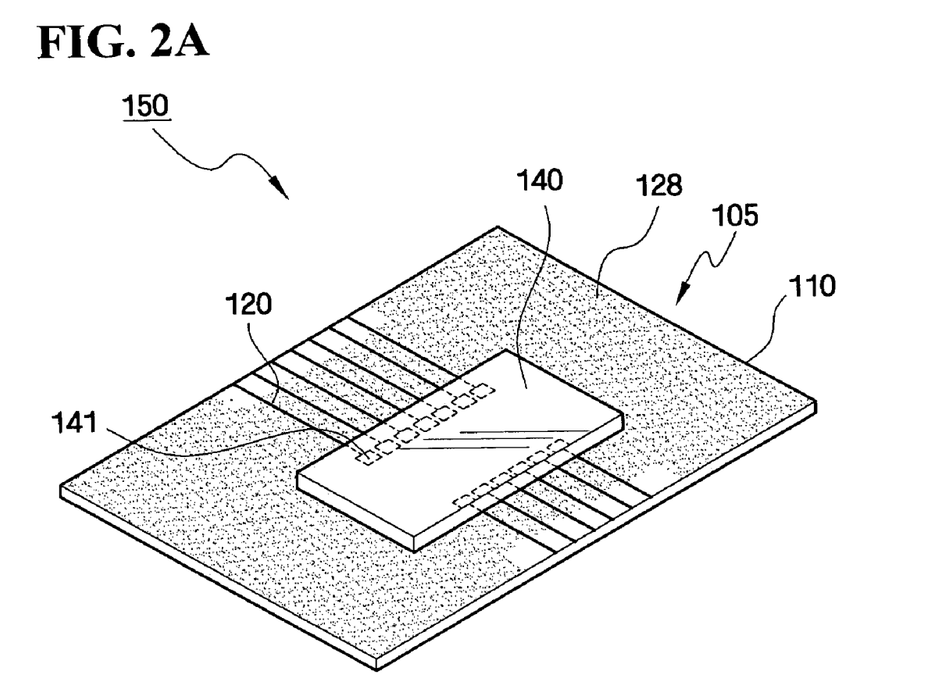
FIG. 2A is a perspective view of a semiconductor chip package according to an exemplary embodiment of the present invention.

FIG. 2A is a perspective view of a semiconductor chip package according to an exemplary embodiment of the present invention. FIG. 2B is a partial enlarged view illustrating a connection between a bump electrode on a semiconductor chip shown in FIG. 2A and an inner lead of a tape circuit substrate and a connection between a pad electrode of a liquid crystal panel and an outer lead of the tape circuit substrate.

A semiconductor chip package 150 according to an exemplary embodiment of the present invention includes a tape circuit substrate 105 and a semiconductor chip 140. For example, like a tape carrier package (TCP) or a chip on film (COF), the tape circuit substrate 105 may be implemented as a flexible printed circuit (FPC) board in which a circuit pattern is formed on a base film.

The tape circuit substrate 105 has a structure in which a connection wire 120 and an inner lead 121 connected to the connection wire 120 are formed on a base film 110 made using a thin insulating material such as, for example, a polyimide resin or a polyester resin. Tape automated bonding (TAB) by which a bump electrode 141 formed on the semiconductor chip 140 is bonded to the inner lead 121 may be used. Hereinafter, a COF will be described as an example of the tape circuit substrate 105.

A tape circuit substrate 105 according to this exemplary embodiment of the present invention includes the base film 110, the inner lead 121, an outer lead 122 and the connection wire. The inner lead 121 extends from a first end of the connection wire 120 in a width direction of the tape circuit substrate 105 and is electrically connected with the bump electrode 141 on the semiconductor chip 140. The outer lead 122 extends from a second end of the connection wire 120 in the width direction of the tape circuit substrate 105 and is electrically connected with a pad electrode 222, which transmits, for example, a driving signal or a power supply voltage signal to a driving signal line, power supply voltage signal line or data line 240 of a liquid crystal panel. The connection wire 120 is formed on the base film 110 and connects the inner lead 121 with the outer lead 122.

The base film 110 is made of an insulating material such as, for example, a polyimide resin or a polyester resin. The connection wire 120 may be made of a conductive material such as a copper (Cu) foil. Preferably, the connection wire 120 may be made by plating a Cu foil with tin, gold, nickel, or solder.

To form the Cu foil used as a material of the connection wire 120 on the base film 110, casting, laminating, or electroplating may be used. Casting is a process of scattering the base film 110 in a liquid state on a rolled Cu foil and performing thermal curing. Laminating is a process of putting a rolled Cu foil on the base film 110 and performing thermal pressing. Electroplating is a process of depositing a Cu seed layer on the base film 110 and supplying electricity to an electrolyte including dissolved Cu after putting the base film 110 into the electrolyte.

The connection wire 120 may be formed by performing photolithography on a Cu foil and performing an etching process to selectively remove portions of the Cu foil.

The inner lead 121 extends from the first end of the connection wire 120 in the width direction of the tape circuit substrate 105 and is connected with the bump electrode 141 formed on the semiconductor chip 140. The bump electrode 141 may be made using a conductive material such as gold (Au), Cu, or solder. The bump electrode 141 and the inner lead 121 may be electrically connected to each other using thermal pressing. A solder resist layer 128 may be formed on a surface of the base film 110 excluding an area on which the semiconductor chip 140 is mounted and an area on which the outer lead 122 connected with the pad electrode 222 of the liquid crystal panel is formed.

The outer lead 122 overlaps with the pad electrode 222 when it is connected with the pad electrode 222 and has a slit at a portion of overlap between the outer lead 122 and the pad electrode 222. The outer lead 122 will be described in more detail when an LCD device is described later.

Figure 3:
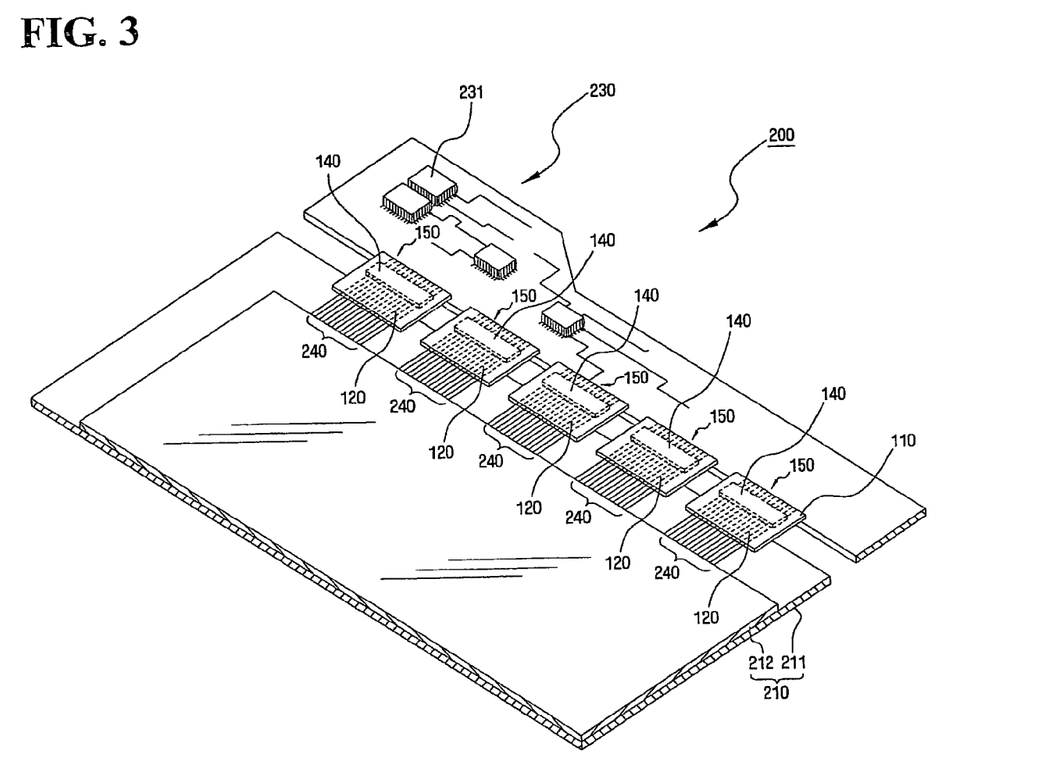
FIG. 3 is a perspective view of an LCD device according to an exemplary embodiment of the present invention.

An LCD device according to an exemplary embodiment of the present invention will be described with reference to FIG. 3. FIG. 3 is a perspective view of an LCD device 200 according to an exemplary embodiment of the present invention.

The LCD device 200 includes a liquid crystal panel 210, a semiconductor chip package 150, and an integrated printed circuit board 230.

The liquid crystal panel 210 includes a lower transparent insulating substrate 211 and an upper transparent insulating substrate 212. A plurality of elements are formed on the lower transparent insulating substrate 211 including, for example, gate lines (not shown), the data lines 240, a thin film transistor (TFT) (not shown), a pixel electrode (not shown), the pad electrode (222 in FIG. 4B) receiving a driving signal or a power supply voltage signal for driving the TFT, etc. A plurality of elements are formed on the upper transparent insulating substrate 212 including, for example a common electrode (not shown), a color filter (not shown), a black matrix (not shown), etc. A liquid crystal (not shown) is disposed between the upper transparent insulating substrate 212 and the lower transparent insulating substrate 211.

In this exemplary embodiment, the upper transparent insulating substrate 212 is smaller than the lower transparent insulating substrate 211 and is stacked on the lower transparent insulating substrate 211. The pad electrode (222 shown in FIGS. 4C and 4D) formed on the lower transparent insulating substrate 211 may be formed by sequentially stacking a first conductive layer (222_2 shown in FIGS. 4C and 4D) and a second conductive layer (222_1 shown in FIGS. 4C and 4D). The first conductive layer 222_2 may be made using a conductive material such as chrome/aluminum (Cr/Al) or molybdenum/aluminum (Mo/Al) and the second conductive layer 222_1 may be made using a transparent conductive material such as indium tin oxide (ITO) or indium zinc oxide (IZO). At side portions of the pad electrode 222, protective layers (241 and 242 shown in FIGS. 4C and 4D) may be formed between the second conductive layer 222_1 and the lower transparent insulating substrate 211.

The semiconductor chip package 150 includes a tape circuit substrate 105 and the semiconductor chip 140. The tape circuit substrate 105 includes the base film 110 made using an insulating material, the inner lead 121 extending from the first end of the connection wire 120 formed on the base film 110 to be electrically connected to the bump electrode 141 on the semiconductor chip 140, and the outer lead 122 extending from the second end of the connection wire 120 to be electrically connected to the pad electrode 222.

The semiconductor chip 140 is mounted on the base film 110 to drive the liquid crystal panel 210. Consequently, the bump electrode 141 of the semiconductor chip 140 is connected with the pad electrode 222 via the inner lead 121, the connection wire 120, and the outer lead 122. The pad electrode 222 is electrically connected to one of the data lines 240.

The integrated printed circuit board 230 includes control elements 231 having an integrated circuit (IC) controlling the semiconductor chip 140. The control elements 231 may input a signal for individually driving each TFT to each semiconductor chip 140.

Connection between the outer lead 122 of the tape circuit substrate 105 and the pad electrode 222 according to an exemplary embodiment of the present invention will be described in detail with reference to FIGS. 4A through 4D.

Figure 4A:
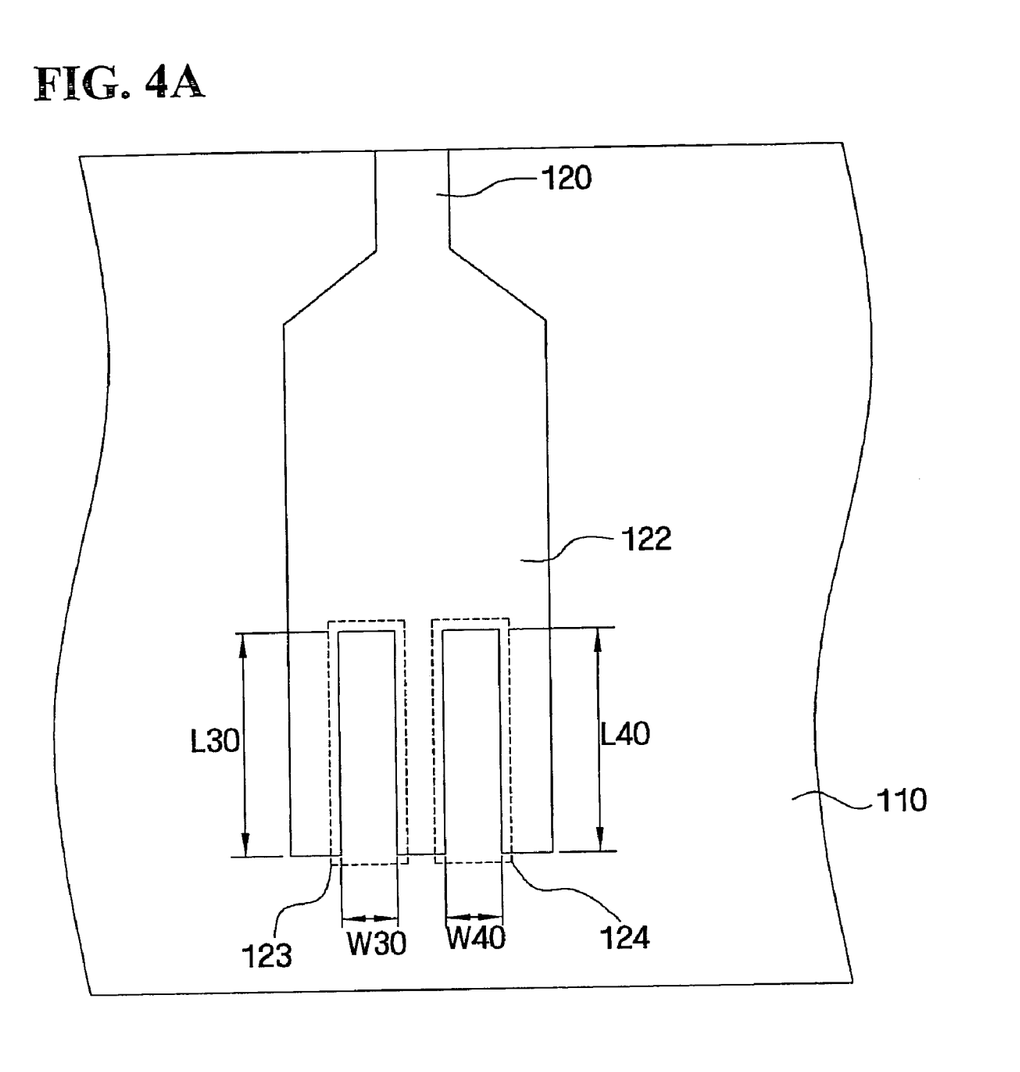
FIG. 4A is a plan view of an outer lead of a tape circuit substrate according to an exemplary embodiment of the present invention.
Figure 4B:
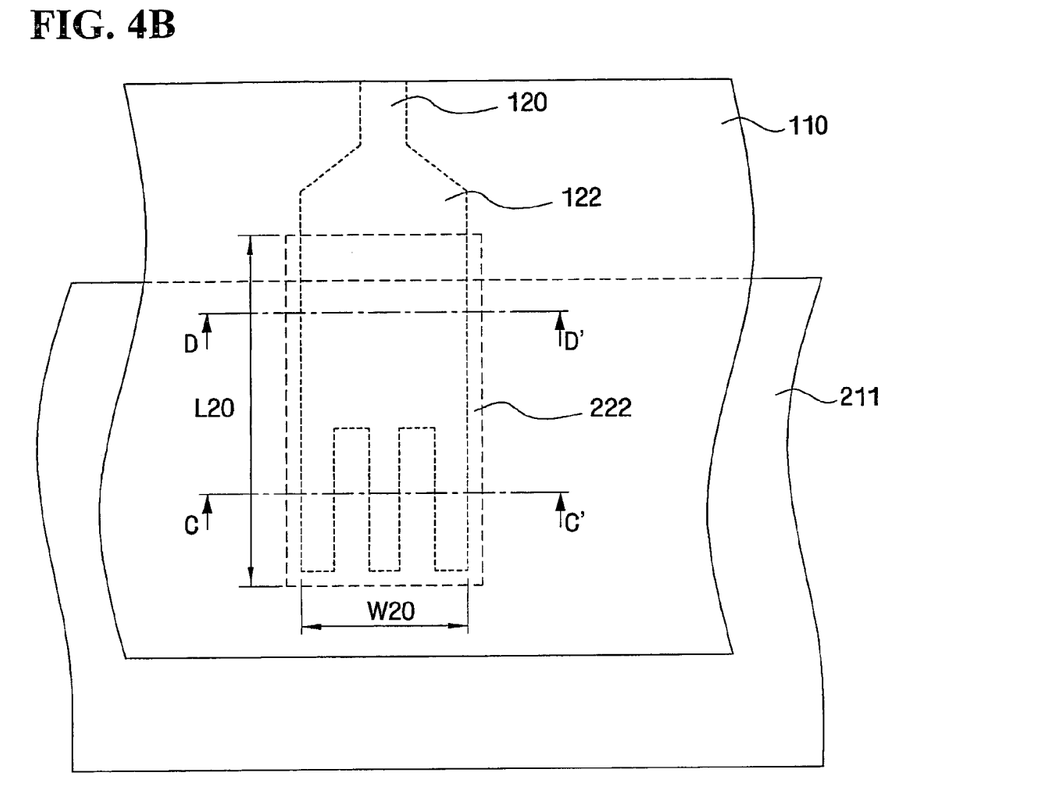
FIG. 4B is a plan view illustrating a connection between the outer lead of the tape circuit substrate shown in FIG. 4A and a pad electrode of a liquid crystal panel.
Figure 4C:
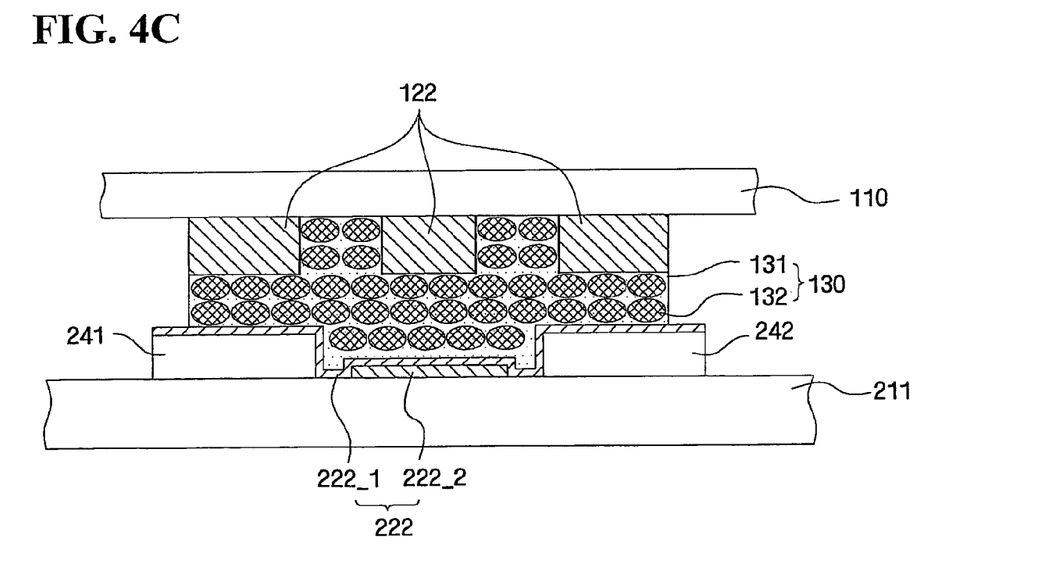
FIG. 4C is a sectional view taken along line C-C' shown in FIG. 4B.
Figure 4D:
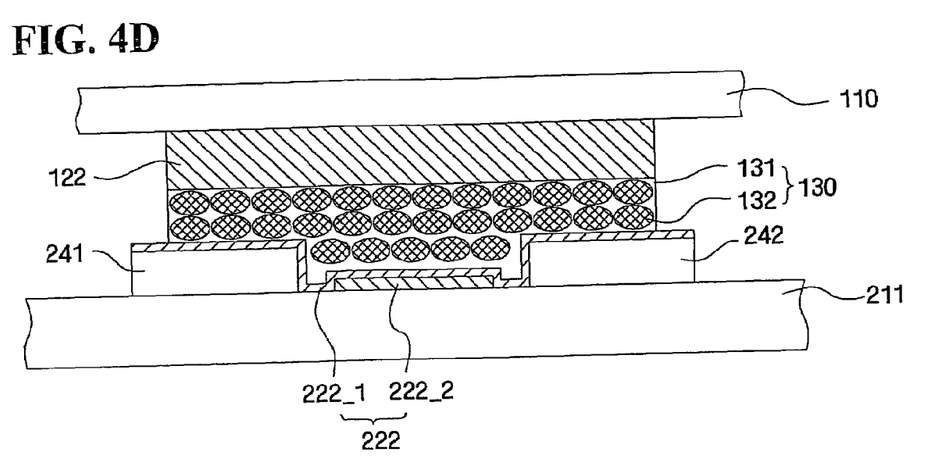
FIG. 4D is a sectional view taken along line D-D' shown in FIG. 4B.

FIG. 4A is a plan view of the outer lead 122 of the tape circuit substrate 105 according to an exemplary embodiment of the present invention. FIG. 4B is a plan view illustrating a connection between the outer lead 122 of the tape circuit substrate 105 shown in FIG. 4A and the pad electrode 222 of the liquid crystal panel 210. FIG. 4C is a sectional view taken along line C-C' shown in FIG. 4B. FIG. 4D is a sectional view taken along line D-D' shown in FIG. 4B.

Figure 2B:
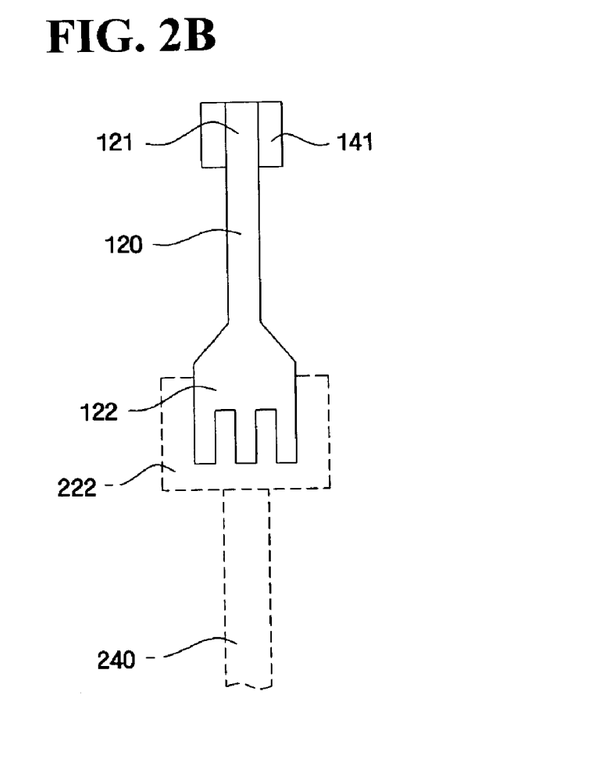
FIG. 2B is a partial enlarged view illustrating a connection between a bump electrode on a semiconductor chip shown in FIG. 2A and an inner lead of a tape circuit substrate and a connection between a pad electrode of a liquid crystal panel and an outer lead of the tape circuit substrate.

The outer lead 122 is connected with the pad electrode 222 at an overlap region including an overlap between the outer lead 122 and the pad electrode 222 as shown in FIG. 2B. The outer lead 122 includes a first slit 123 and a second slit 124 formed by removing a predetermined portion of the outer lead 122 in the overlap region. Thus, for example, each of the first and second slits 123 and 124 includes three edges defined by the outer lead 122.

To connect the pad electrode 222 and the outer lead 122 in the overlap region, an anisotropic conductive film (ACF) 130 is used. The first and second slits 123 and 124 each provide a surge volume receptive to the ACF 130.

The ACF 130 includes conductive balls 132 within a thermosetting resin such as an epoxy resin 131. When the ACF 130 is positioned between the pad electrode 222 and the outer lead 122 and then pressurized, the epoxy resin 131 of the ACF 130 spreads out to a side space of the pad electrode 222 and the outer lead 122. Thus, the epoxy resin 131 is hardened and the conductive balls 132 are pressed between the pad electrode 222 and the outer lead 122. As a result, the pad electrode 222 and the outer lead 122 are electrically connected with each other via the conductive balls 132.

When the ACF 130 positioned between the pad electrode 222 and the outer lead 122 including the first and second slits 123 and 124 formed in the overlap region between the outer lead 122 and the pad electrode 222 is pressurized, the epoxy resin 131 can satisfactorily spread out from between the pad electrode 222 and the outer lead 122 into the first and second slits 123 and 124, as shown in FIG. 4C.

Accordingly, the conductive balls 132 can effectively contact the outer lead 122 and the pad electrode 222. As a result, even when a width of the pad electrode 222 or the outer lead 122 is broad, contact reliability between the pad electrode 222 and the outer lead 122 can be satisfactorily achieved.

Meanwhile, as shown in FIG. 4D, in a region where the slits 123 and 124 are not formed, the conductive balls 132 contact the outer lead 122 and the pad electrode 222 by pressurizing the ACF 130 positioned between the outer lead 122 and the pad electrode 222, and therefore, the outer lead 122 contacts the pad electrode 222 in a sufficient area to effectively reduce contact resistance between the outer lead 122 and the pad electrode 222.

In a tape circuit substrate 105 according to an exemplary embodiment of the present invention, the first and second slits 123 and 124 are formed in the outer lead 122 so that contact reliability is improved and contact resistance is decreased between the outer lead 122 and the pad electrode 222.

It is preferable that the first and second slits 123 and 124 are formed in an outer lead 122 that transmits a power supply voltage signal such as a TFT ON voltage (e.g., a DC voltage of 20 through 30 V) or a TFT OFF voltage (e.g., a DC voltage of −5 through −10 V). When necessary, the first and second slits 123 and 124 may be formed in an outer lead 122 that transmits a driving signal.

Figure 5:
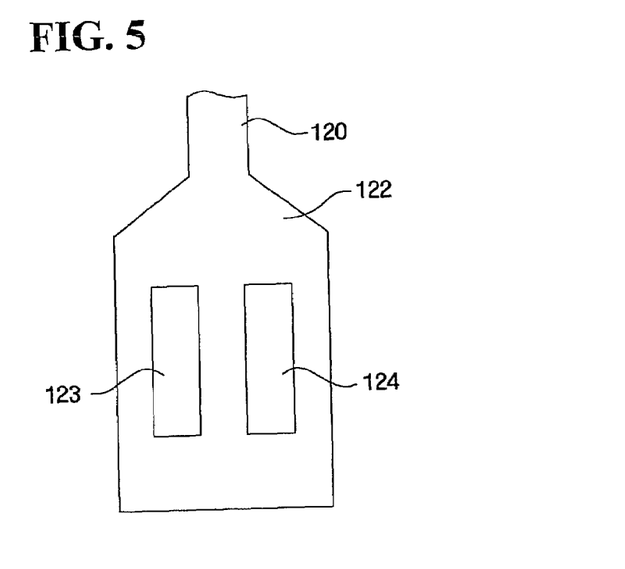
FIG. 5 is a plan view of an outer lead of a tape circuit substrate, which has a slit according to an exemplary embodiment of the present invention.

The first and second slits 123 and 124 may be formed at other various positions in the outer lead 122. In an exemplary embodiment of the present invention, the first and second slits are disposed at an interior portion of the outer lead 122, as shown in FIG. 5. Thus, for example, each of the first and second slits 123 and 124 includes four edges defined by the outer lead 122.

It is preferable that the first and second slits 123 and 124 are formed at an end portion of the outer lead 122. In such a case, since the epoxy resin 131 of the ACF 130 spreads out into the first and second slits 123 and 124, contact reliability between the outer lead 122 and the pad electrode 222 is more effectively achieved.

It is preferable that a first slit width W30 of the first slit 123 and a second slit width W40 of the second slit 124 are at least 1/20 of a width W20 of the overlap between the pad electrode 222 and the outer lead 122. Thus, since the epoxy resin 131 of the ACF 130 spreads out into the first and second slits 123 and 124, contact reliability between the outer lead 122 and the pad electrode 222 is more effectively achieved.

It is preferable that a first slit length L30 of the first slit 123 and a second slit length L40 of the second slit 124 are about 1/10 through about 9/10 of a length L20 of the overlap between the pad electrode 222 and the outer lead 122. When the first and second slit lengths L30 and L40 are less than 1/10 of the length L20 of the overlap, the epoxy resin 131 of the ACF 130 cannot effectively spread out into the first and second slits 123 and 124, and therefore, contact reliability between the outer lead 122 and the pad electrode 222 is not effectively achieved. When the first and second slit lengths L30 and L40 exceed 9/10 of the length L20 of the overlap, a contact area between the outer lead 122 and the pad electrode 222 is not sufficient to achieve reduced contact resistance between the outer lead 122 and the pad electrode 222.

In an alternative exemplary embodiment, additional slits are formed in the outer lead 122 along with the first and second slits 123 and 124. In such a case, since the epoxy resin 131 of the ACF 130 effectively spreads out into the slits, contact reliability between the outer lead 122 and the pad electrode 222 is more effectively achieved.

It is preferable that the first and second slit widths W30 and W40 are substantially equal. If additional slits are formed in the outer lead 122, it is preferable that lengths of all slits are substantially equal to the first and second slit lengths L30 and L40 and that widths of all slits are substantially equal to the first and second slit widths W30 and W40. Thus, since the epoxy resin 131 of the ACF 130 uniformly spreads out through all slits, contact reliability between the outer lead 122 and the pad electrode 222 is more effectively achieved.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

The LCD device includes a slit at an end portion of an outer lead of the tape circuit substrate in an overlap region between the outer lead and a pad electrode of a liquid crystal panel.

The slit has a length less than a length of the overlap region between the pad electrode and the outer lead and a width less than that of the overlap region between the pad electrode of the liquid crystal panel and the outer lead of the tape circuit substrate, thereby effectively improving contact reliability and decreasing contact resistance between the outer lead and the pad electrode.

What is claimed is:

1. A liquid crystal display device comprising:
    a liquid crystal panel including a pad electrode receiving one of a driving signal and a power supply voltage signal;
    a tape circuit substrate including a base film made of an insulating material, and a signal line formed on the base film and having a slit at a portion of the signal line which overlaps the pad electrode of the liquid crystal panel; and
    an anisotropic conductive film connecting the signal line with the pad electrode;
    wherein the signal line comprises:
    an inner lead electrically connected to a semiconductor chip;
    an outer lead formed on the base film and having the slit; and
    a connection wire formed on the base film to electrically connect the inner lead to the outer lead; and
    wherein collective portions of the outer lead defined by the slit are connected to a single pad electrode.

2. The liquid crystal display device of claim 1, wherein the slit is formed at an end portion of the outer lead.

3. The liquid crystal display device of claim 2, wherein the slit includes three edges defined by the outer lead.

4. The liquid crystal display device of claim 1, wherein the slit has a width being at least 1/20 of a width of an overlap region between the pad electrode and the outer lead.

5. The liquid crystal display device of claim 1, wherein the slit has a length ranging from about 1/10 to about 9/10 of a length of an overlap region between the pad electrode and outer lead.

6. The liquid crystal display device of claim 1, wherein the outer lead further comprises a plurality of slits.

7. The liquid crystal display device of claim 6, wherein each of the slits has a same width.

8. The liquid crystal display device of claim 6, wherein each of the slits has a same length.

9. The liquid crystal display device of claim 1, wherein the slit is formed at an interior portion of the outer lead such that the slit includes four edges defined by the outer lead.

10. The liquid crystal display device of claim 1, wherein the slit provides a surge volume to receive the anisotropic conductive film in response to pressurizing the anisotropic conductive film between the outer lead and the pad electrode.

11. A semiconductor chip package comprising:
   a tape circuit substrate including a base film made using an insulating material, an inner lead electrically connected to a semiconductor chip, an outer lead formed on the base film and having a slit disposed at an overlap region between a pad electrode of a liquid crystal panel and the outer lead, and a connection wire formed on the base film to electrically connect the inner lead to the outer lead; and
   a semiconductor chip mounted on the tape circuit substrate to be electrically connected to the inner lead;
   wherein collective portions of the outer lead defined by the slit are connected to a single pad electrode.

12. The semiconductor chip package of claim 11, wherein the slit is formed at an end portion of the outer lead.

13. The semiconductor chip package of claim 11, wherein the slit is formed at an interior portion of the outer lead such that the slit includes four edges defined by the outer lead.

14. A tape circuit substrate comprising:
   a base film made of an insulating material;
   an inner lead electrically connected to a semiconductor chip;
   an outer lead formed on the base film and having a slit disposed at an overlap region between a pad electrode of a liquid crystal panel and the outer lead, the slit being formed at an end portion of the outer lead; and
   a connection wire formed on the base film to electrically connect the inner lead to the outer lead
   wherein collective portions of the outer lead defined by the slit are connected to a single pad electrode.

15. The tape circuit substrate of claim 14, wherein the slit provides a surge volume to receive an anisotropic conductive film that connects the outer lead to the pad electrode in response to pressurizing the anisotropic conductive film between the outer lead and the pad electrode.

16. The tape circuit substrate of claim 14, wherein the slit has a width being at least 1/20 of a width of the overlap region.

17. The tape circuit substrate of claim 14, wherein the slit has a length ranging from about 1/10 to about 9/10 of a length of the overlap region.

18. The tape circuit substrate of claim 14, wherein the outer lead further comprises a plurality of slits.

19. The tape circuit substrate of claim 18, wherein each of the slits has at least one of a same length and a same width.

20. The liquid crystal display device of claim 1, wherein a portion that connects the connection wire and the outer lead has a structure that gradually increases in width toward the outer lead.

21. The semiconductor chip package of claim 11, wherein a portion that connects the connection wire and the outer lead has a structure that gradually increases in width toward the outer lead.

22. The tape circuit substrate of claim 14, wherein a portion that connects the connection wire and the outer lead has a structure that gradually increases in width toward the outer lead.

* * * * *